United States Patent [19]
Hower et al.

[11] Patent Number: 5,712,193
[45] Date of Patent: Jan. 27, 1998

[54] METHOD OF TREATING METAL NITRIDE FILMS TO REDUCE SILICON MIGRATION THEREIN

[75] Inventors: Glen Roy Hower, Allen Township, Northampton County; Daniel David Kostelnick, Whitehall Township, Lehigh County, both of Pa.; Yih-Cheng Shih, Hsin-Chu, Taiwan

[73] Assignee: Lucent Technologies, Inc., Murray Hill, N.J.

[21] Appl. No.: 367,377

[22] Filed: Dec. 30, 1994

[51] Int. Cl.$^6$ ................................................ H01L 21/28
[52] U.S. Cl. ........................ 437/187; 437/190; 437/192; 427/535
[58] Field of Search ................................ 437/187, 192, 437/190, 195, 238; 427/535

[56] References Cited

U.S. PATENT DOCUMENTS

| | | | |
|---|---|---|---|
| 5,232,871 | 8/1993 | Ho | 437/190 |
| 5,389,575 | 2/1995 | Chin et al. | 437/190 |
| 5,567,483 | 10/1996 | Foster et al. | 427/535 |
| 5,593,511 | 1/1997 | Foster et al. | 437/238 |

OTHER PUBLICATIONS

Stanley Wolf "Silicon Processing for the VLSI Era, vol. II" Lattice Press, Calif. (1990) pp. 192–193.

*Primary Examiner*—John Niebling
*Assistant Examiner*—C. Everhart
*Attorney, Agent, or Firm*—Scott W. McLellan

[57] ABSTRACT

A method of treating the surface of a metal nitride barrier layer on an integrated circuit to reduce the movement of silicon through the barrier. The metal nitride barrier (such as TiN) is exposed to a nitrogen plasma, thereby improving the barrier properties of the metal nitride barrier.

14 Claims, 1 Drawing Sheet

METHOD OF TREATING METAL NITRIDE FILMS TO REDUCE SILICON MIGRATION THEREIN

FIELD OF THE INVENTION

This invention relates to integrated circuit fabrication generally and, more specifically, to the metalization layers thereon. Still more specifically, the invention relates to the processing of the metal layers on an integrated circuit.

BACKGROUND OF THE INVENTION

Titanium (Ti), tungsten (W) and aluminum (Al) metal systems are widely used in integrated circuit manufacturing to form the conductors disposed on a semiconductor chip. As is well known, the aluminum is used as the grid-like "runners" on the chip. The titanium is used to form the contacts to the semiconductor substrate or polysilicon layers. Tungsten interconnects the titanium contacts with the aluminum runners and interconnects different levels of the aluminum runners (the titanium also being used as a barrier between the aluminum and tungsten).

The usual process for depositing the tungsten is by chemical vapor deposition, or CVD. However, the typical W-CVD process uses fluorine and the presence of fluorine and any free silicon at the Ti/W interface causes the formation of defects (known as volcano defects because of the shape thereof) between the Ti and W. These defects can raise the resistance of the Ti/W interface.

To reduce the number of defects, a barrier layer of titanium nitride (TiN) is disposed between the titanium and tungsten layers to further isolate any silicon passing through the Ti layer from reaching the W/TiN interface. However, the TiN layer alone is insufficient as a free silicon barrier. Thus, the Ti layer is still needed beneath the TiN layer. However, the defect density with both Ti and TiN layers present may still be too high for economic chip manufacturing because of reduced chip yields.

We have found that one reason that the TiN layer does not work as well as desired is the presence of pin holes in the TiN layer. The pin holes facilitate the movement (such as by diffusion) of the silicon through the TiN layer. To decrease the movement of silicon through the TiN layer, a nitrogen anneal process of the TiN layer has been successfully used to improve the barrier action of the TiN layer. The anneal process involves exposing the wafer for several minutes to a nitrogen atmosphere at a temperature of about 1100° C. Generally, the longer the exposure to the high temperature anneal, the better the TiN layer is as a silicon diffusion barrier. The anneal, however, has a significant detrimental impact on transistors formed in the wafer.

The maximum time-temperature product a bipolar or field-effect transistor may be subject to during fabrication is commonly known as the thermal budget of the transistor. The thermal budget is limited to avoid undersirable changes in the characteristics of the transistor as a result of undesired diffusion of the dopants (such as boron) within the transistor. Each step in the fabrication process of the wafer (e.g., plasma etching, oxide growth, etc.) must be accounted for against the thermal budget. The "cost" of the nitrogen anneal is very high. For example, the temperature of the above nitrogen anneal alone is so high that with the time needed to do an effective anneal of the TiN layer, the thermal budget for bipolar transistors may be exceeded. For field-effect transistors, the thermal budget is substantially used up by the anneal.

Thus, it is desirable to have a better process that provides for fewer defects between the TiN layer and the W-CVD layer than does the nitrogen anneal process.

Further, it is desirable to increase the effectiveness of the TiN barrier layer beyond what is provided by nitrogen anneal process.

Still further, it is desirable that the detrimental impact such a process may have on the characteristics of the bipolar or field-effect transistor be less than that of the nitrogen anneal process.

SUMMARY OF THE INVENTION

These and other aspects of the invention are provided for generally in a method of making an integrated circuit, the integrated circuit having a substrate, a layer of a first metal and a layer of a nitride of the first metal on and in contact with the first metal layer. The method includes the step of exposing the layer of nitrided first metal to a nitrogen plasma. The nitrogen plasma "treatment" of the nitrided first metal reduces the movement of silicon through the nitrided layer.

BRIEF DESCRIPTION OF THE DRAWING

The foregoing features of this invention, as well the invention itself, may be more fully understood from the following description of the drawings, in which.

DETAILED DESCRIPTION

Figure 1:
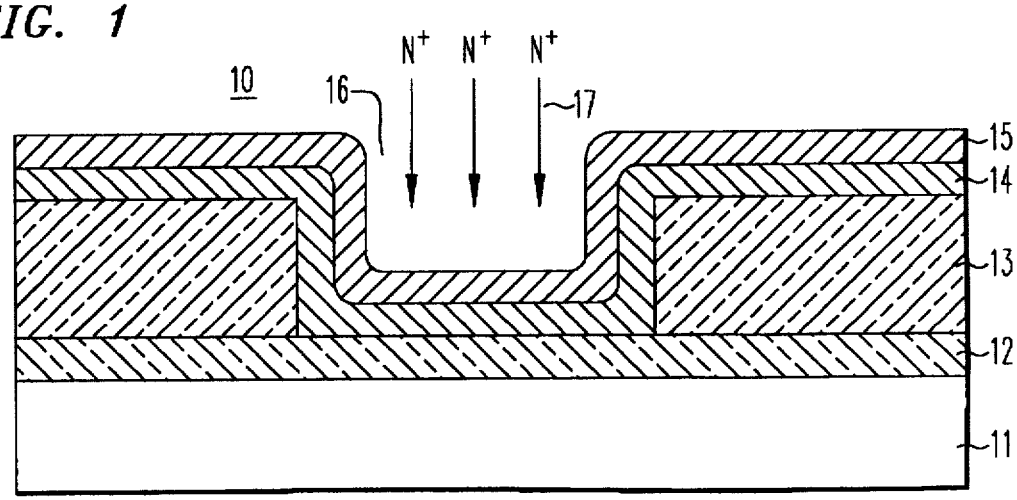
FIGS. 1–3 is a simplified cross-sectional view of a partially completed exemplary integrated circuit (not to scale) showing an exemplary nitrogen plasma treatment according to one embodiment of the invention.

A partially completed exemplary integrated circuit wafer 10 is shown in FIG. 1. The integrated circuit wafer 10 at this stage comprises a semiconductor substrate 11 with a layer of polysilicon 12 thereon. The substrate 11 surface may include at its surface an already fabricated transistor (not shown). An opening (via) 16 in an oxide layer 13 exposes at least a portion of the polysilicon layer 12. The polysilicon 12 may be an exemplary emitter or base contact to a bipolar transistor (not shown). It is understood, however, that the polysilicon layer 12 may be absent and the via opening 16 in the oxide layer be completely down to the substrate 11 to allow for direct contact to the substrate 11 for source and drain contacts in a field-effect transistor, for example.

In a typical fabrication process, a titanium layer 14 (a first metal layer) is deposited (such as by sputtering) onto the oxide layer 13 and the exposed polysilicon layer 12 to form a contact to the layer 12. Next, a layer of titanium nitride (TiN) 15 (a nitride of the first metal) is deposited (such as by sputtering) over the titanium 14. Other methods may be used to deposit the Ti and TiN layers 14, 15, such as by evaporation.

In the preferred embodiment of the invention, the TiN layer 15 is "treated" by a nitrogen plasma 17 to reduce the silicon movement through the TiN layer 15. The nitrogen plasma treatment has been observed to remove small pin holes and "plug" larger ones in the TiN layer 15. Advantageously, the temperature of the wafer in the plasma anneal is low, approximately 400° C. or lower, thus having substantially little or no impact on the thermal budget of the transistors being fabricated.

The plasma treatment process parameters are not critical. Exemplary operational ranges for the plasma treatment process are as follows:

| | | |
|---|---|---|
| nitrogen pressure | 0.1–100 | Torr |
| power | 50–500 | Watts |
| time | 10–600 | Seconds |
| substrate temperature | 300–600 | °C. |

In the preferred process, the wafer 10 is exposed to the nitrogen plasma 17 for about 60 seconds at a power level of about 175 watts and at an approximate pressure of 1 Torr. The TiN layer thickness is not critical but for the above values an approximate thickness ranged between 40 and 500 nm, although other values are possible and not critical.

Figure 2:
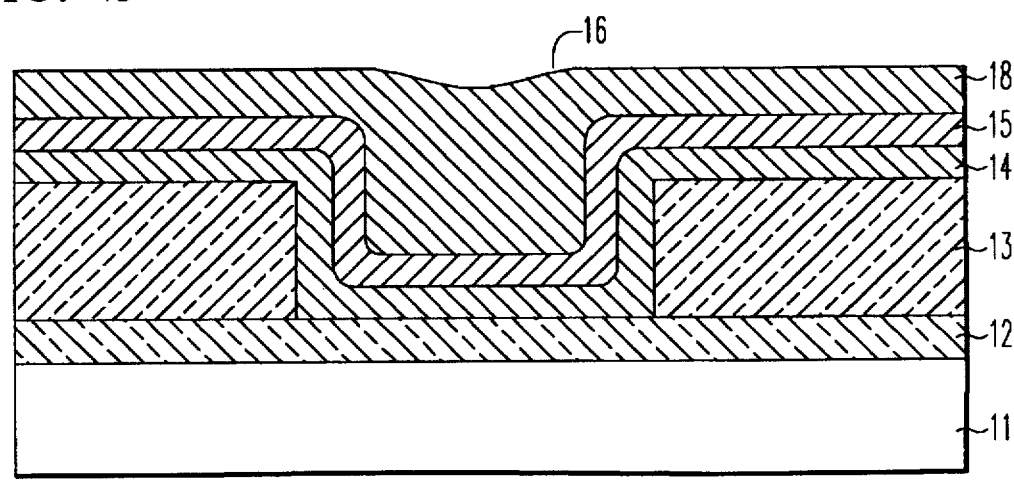

In FIG. 2, after the nitrogen plasma treatment of the TiN layer 15, a tungsten layer 18 (a second metal layer) is preferably deposited by a conventional non-plasma chemical vapor deposition (CVD) process, although other processes may be used to perform the deposition, such as by evaporation. The CVD process involves exposing the wafer 10 to an atmosphere containing $WF_6$ which decomposes in the presence of hydrogen into W, HF and some free fluorine. The tungsten metal preferentially attaches itself to the exposed TiN layer. However, as mentioned above, the fluorine reacts with any silicon that may be available, thus forming the undesired reaction products that may interfere with the metallurgical bond between the tungsten layer 18 and the TiN layer 15 and cause defects. The nitrogen plasma treatment of the TiN layer 15 reduces the number of defects at the W/Ti interface and, as a result and as discussed below, reduces the average resistance of the W/TiN interface.

Figure 3:
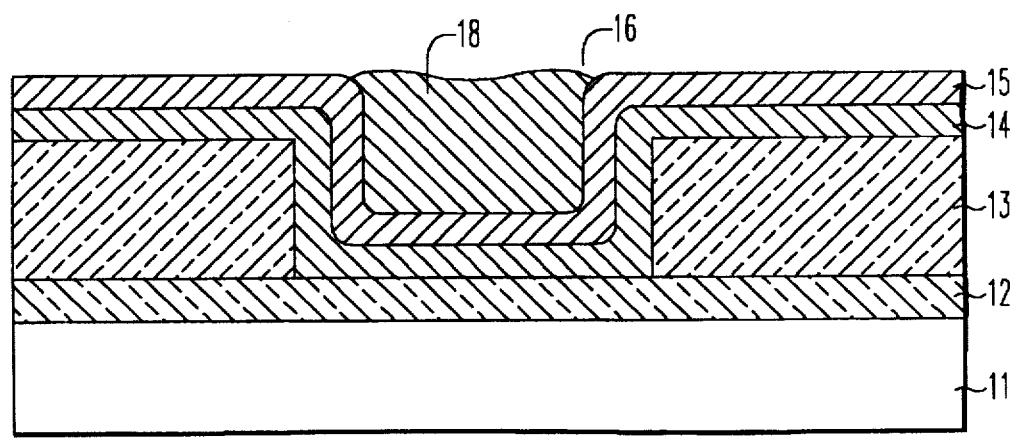

As shown, the tungsten layer 18 fills the via opening 16 in the oxide layer 13 and contacts the TiN layer 15. The tungsten layer 18 is then etched back in FIG. 3 to form a vertical conductor or "plug" in the via 16 which will interconnect the Ti/TiN contacts with the subsequently formed conventional aluminum conductors. The TiN layer 15 also serves as an etch stop during the tungsten etch. The tungsten etch is preferably a conventional plasma etch but other etches, such as RIE, may be used.

Using the preferred treatment process for the TiN layer 15, the etch selectivity of the tungsten layer 14 over the TiN layer 15 significantly improved over not using any treatment at all. The increase in selectivity resulted in a more uniform etch (approximately 40%, depending upon tungsten plasma etch time) across a wafer 10. Moreover, the average resistance of the W—TiN interface decreased with a more uniform distribution of interface resistance across the wafer 10. An additional advantage of this process is the ability to do the nitrogen plasma in the same chamber as the tungsten CVD process. Such a chamber is typically designed to generate a plasma for cleaning purposes.

While the metals titanium and tungsten have been used in the exemplary embodiment as the first and second metals on the wafer 10, other metals may be used. For example, molybdenum, platinum, gold, nickel, cobalt, or aluminum, singly or in combination, may be used as appropriate.

Having described the preferred embodiment of the invention, it will be apparent to one of skill in the art that other embodiments incorporating its concept may be used. Therefore, this invention should not be limited to the disclosed embodiment, but rather should be limited only by the spirit and scope of the appended claims.

We claim:

1. A method of making an integrated circuit, the integrated circuit having a substrate, a layer of a first metal and a layer of a nitride of the first metal on and in contact with the first metal layer, characterized by the step of:

exposing the layer of nitrided first metal to a nitrogen plasma in a reactor containing nitrogen at a pressure between 0.1 and 100 Torr.

2. The method recited in claim 1, further characterized by the nitrogen plasma step is performed at a power level between 50 and 500 watts for between 10 and 600 seconds.

3. The method recited in claim 2, wherein the deposition of the first metal layer and the layer of first metal nitride is by sputtering and further comprising the step of depositing a second metal layer by a chemical vapor deposition process.

4. The method recited in claim 3, wherein the plasma step and the chemical vapor deposition of the second metal layer step occurs within the same reactor.

5. The method recited in claim 4, wherein the first metal is titanium and the second metal is tungsten.

6. A method of making an integrated circuit having a substrate, including the steps of:

depositing a first metal layer over the substrate;

depositing a layer of a nitride of the first metal over and in contact with the first metal layer; and depositing a second metal layer over and in contact with the nitride of the first metal;

characterized by the step of:

exposing the layer of nitrided first metal to a nitrogen plasma after the deposition thereof and before deposition of the second metal layer;

wherein the nitrogen plasma step is performed in a reactor containing nitrogen at a pressure between 0.1 and 100 Torr at a power level between 50 and 500 watts for between 10 and 600 seconds.

7. The method recited in claim 6, wherein the deposition of the first metal layer and the layer of first metal nitride is by sputtering and the deposition of the second metal layer is by a chemical vapor deposition process.

8. The method recited in claim 7, wherein the plasma step and the chemical vapor deposition of the second metal layer step occurs within the same reactor.

9. The method recited in claim 8, wherein the first metal is titanium and the second metal is tungsten.

10. The method recited in claim 6, wherein the plasma step is performed while said substrate is held at a temperature between 300° and 600° C.

11. The method of claim 6, wherein said temperature is 400° C. or less.

12. A method of making an integrated circuit having a substrate, including the steps of:

sputtering a titanium layer over the substrate;

sputtering titanium nitride layer over and in contact with the titanium layer; and depositing a tungsten layer over and in contact with the titanium nitride layer;

characterized by the step of:

exposing the titanium nitride layer to a nitrogen plasma after the deposition thereof and before the deposition of the tungsten layer;

wherein the nitrogen plasma step is performed in a reactor containing nitrogen at a pressure between 0.1 and 100 Torr at a power level between 50 and 500 watts for between 10 and 600 seconds.

13. The method recited in claim 12, wherein the tungsten layer is deposited with a chemical vapor deposition process.

14. The method recited in claim 13, wherein the plasma step and the chemical vapor deposition of the tungsten layer step occurs within the same reactor.

* * * * *